(12) United States Patent
Freeman et al.

(10) Patent No.: US 10,191,108 B2
(45) Date of Patent: Jan. 29, 2019

(54) ON-CHIP SENSOR FOR MONITORING ACTIVE CIRCUITS ON INTEGRATED CIRCUIT (IC) CHIPS

(71) Applicant: GLOBALFOUNDRIES Inc., Grand Cayman (KY)

(72) Inventors: Gregory G. Freeman, Wappingers Falls, NY (US); Siyuranga Koswatta, Carmel, NY (US); Paul S. McLaughlin, Poughkeepsie, NY (US); Daniel J. Poindexter, Cornwall-on-Hudson, NY (US); J. Campbell Scott, Los Gatos, CA (US); Scott Taylor, Austin, TX (US); Gregory Uhlmann, Rochester, MN (US); James D. Warnock, Somers, NY (US)

(73) Assignee: Globalfoundries Inc., Grand Cayman (KY)

( * ) Notice: Subject to any disclaimer, the term of this patent is extended or adjusted under 35 U.S.C. 154(b) by 505 days.

(21) Appl. No.: 14/945,520

(22) Filed: Nov. 19, 2015

(65) Prior Publication Data
US 2017/0146592 A1 May 25, 2017

(51) Int. Cl.
*G01R 33/36* (2006.01)
*G01R 31/28* (2006.01)

(52) U.S. Cl.
CPC ..... *G01R 31/2858* (2013.01); *G01R 31/2884* (2013.01)

(58) Field of Classification Search
CPC .............. G01R 31/2601; G01R 31/025; G01R 31/2621; G01R 31/2855; G01R 31/2896; G01R 31/2874; G01R 31/26; G01R 31/2607; G01R 31/12; G01R 31/3187; G01R 31/318371; G01R 31/318547; G01R 31/31703; G01R 31/31727; G01R 31/31724
USPC .... 324/537, 76.59, 322, 382, 406–408, 224, 324/750.3, 757.02, 762.02–763.01; 702/64, 65, 108, 117–121, 126, 182–185; 714/733, 738, 718, 735
See application file for complete search history.

(56) References Cited

U.S. PATENT DOCUMENTS

| | | | |
|---|---|---|---|
| 4,593,820 A * | 6/1986 | Antonie | ............... B07C 5/344 209/573 |
| 5,264,377 A | 11/1993 | Chesire et al. | |
| 5,448,179 A | 9/1995 | Burns | |
| 5,723,875 A | 3/1998 | Abe et al. | |

(Continued)

FOREIGN PATENT DOCUMENTS

JP 2011091214 5/2011

*Primary Examiner* — Jermele M Hollington
*Assistant Examiner* — Taqi Nasir
(74) *Attorney, Agent, or Firm* — DeLio, Peterson & Curcio, LLC; Robert Curcio (57) ABSTRACT

A sensor for on-chip monitoring the effects of operating conditions on a circuit, Integrated Circuit (IC) chips including the sensors, and a method of monitoring operating condition effects on-chip circuits, e.g., for the occurrence of electromigration. The sensor includes a multi-fingered driver associated with a monitored circuit, sensitive to known circuit parameter sensitivities. Sense and control logic circuit selectively driving the multi-fingered driver, and selectively monitoring for an expected multi-fingered driver response.

20 Claims, 7 Drawing Sheets

(56) References Cited

U.S. PATENT DOCUMENTS

| | | | | |
|---|---|---|---|---|
| 5,764,409 A | * | 6/1998 | Colvin | G01R 31/307 |
| | | | | 267/140 |
| 5,903,160 A | * | 5/1999 | Ianenko | G01R 31/2805 |
| | | | | 324/537 |
| 5,910,874 A | * | 6/1999 | Iniewski | H02H 9/046 |
| | | | | 361/111 |
| 6,130,549 A | * | 10/2000 | Buck | H03K 17/162 |
| | | | | 326/26 |
| 6,812,718 B1 | * | 11/2004 | Chong | G01R 1/07342 |
| | | | | 324/754.07 |
| 6,819,124 B1 | | 11/2004 | Allee et al. | |
| 6,885,210 B1 | | 4/2005 | Suzuki | |
| 7,208,984 B1 | * | 4/2007 | Petrofsky | H03K 3/012 |
| | | | | 326/82 |
| 7,512,506 B2 | | 3/2009 | Aubel et al. | |
| 7,971,171 B2 | | 6/2011 | Keinert et al. | |
| 8,039,870 B2 | | 10/2011 | Burke et al. | |
| 8,089,744 B1 | | 1/2012 | Rahim et al. | |
| 8,217,461 B1 | | 7/2012 | Chu et al. | |
| 8,340,923 B2 | | 12/2012 | Wood et al. | |
| 8,519,730 B2 | | 8/2013 | Miyazaki | |
| 8,653,844 B2 | | 2/2014 | Sadoughi et al. | |
| 8,723,265 B2 | | 5/2014 | Chen et al. | |
| 8,928,411 B2 | | 1/2015 | Parker et al. | |
| 8,949,767 B2 | | 2/2015 | Bickford et al. | |
| 2005/0012535 A1 | * | 1/2005 | Ikezaki | H03K 17/167 |
| | | | | 327/205 |
| 2005/0119911 A1 | * | 6/2005 | Ayan | G01V 11/00 |
| | | | | 703/10 |
| 2007/0013390 A1 | * | 1/2007 | Kuitani | G01R 1/07342 |
| | | | | 324/756.03 |
| 2009/0218999 A1 | * | 9/2009 | Kikuchi | H02M 3/156 |
| | | | | 323/282 |
| 2012/0049926 A1 | * | 3/2012 | Shimizu | H03D 7/165 |
| | | | | 327/355 |
| 2012/0313177 A1 | | 12/2012 | Chen et al. | |
| 2014/0125235 A1 | * | 5/2014 | van den Berg | H05B 33/0809 |
| | | | | 315/185 R |

\* cited by examiner

ON-CHIP SENSOR FOR MONITORING ACTIVE CIRCUITS ON INTEGRATED CIRCUIT (IC) CHIPS

BACKGROUND

The present invention generally relates to Integrated Circuit (IC) chips and more particularly to monitoring and reducing IC chip electro-migration failures.

To minimize semiconductor circuit power consumption, most Integrated Circuit (IC) chips are made in the well-known complementary insulated gate field effect transistor (FET) technology known as CMOS. A typical CMOS circuit includes paired complementary devices, i.e., an n-type FET (NFET) paired with a corresponding p-type FET (PFET), frequently gated by the same signal. The current each FET or device can provide is directly proportional to the channel width (W) to length (L) ratio (W/L) of the particular device. Thus, a high power devices tends to have a very high width to length ratio. Even with a minimum channel width, a high powered single device, e.g., with W/L at or above 100, might tend to have a somewhat meandering wide, short aspect ratio. However, ten (10) parallel connected devices with W/L=10 have the same current capacity as the single wide device with a potentially much more compact footprint that approaches a square.

Thus, designers normally design these high powered devices as parallel or ganged devices with fingered gates, sources and drains all tied or connected in parallel. Similarly, in a typical standard cell logic chip, where the logic is implemented from a library of lower order logic circuits, books or cells, power from an underpowered book output may be increased by adding one or more parallel drivers to power up and drive that book output. Also, some modern IC chips have FET channels formed on surface ridges or fins for improved density. FETs formed on a single fin, called FinFETs, are width limited by the fin size with correspondingly limited current. Thus, designers also parallel multiple connected FinFETs to increase FinFET current capacity. However, increasing current capacity may increase local circuit sensitivities, for example, to heat damage.

Typical semiconductor fabrication materials, especially dielectrics, have poor thermal conductivity. High transient current from these large multi-fingered drivers switching rapidly, e.g., at a several gigahertz (GHz), can very rapidly cause very localized heating. Further, these drivers may alternate between periods of relative dormancy and periods of near maximum switching. Thus, localized heating from a small, isolated circuit can build rapidly into a random hot spot separated by periods of abatement. These hot spots may be the source of unsuspected failures, including redundancy faults, e.g., the loss of one of the ganged devices/drivers.

For example, current density and temperature in one of these hot spots can cause electromigration (EM) that open circuit connecting wires or lines, e.g., supply ($V_{dd}$ or ground) lines or signal outputs. Designers identify electro-migration concerns during chip design with EM modeling. Once identified, designers can address those concerns with more robust metal wiring and by limiting maximum chip operating frequency ($F_{max}$). However, limiting $F_{max}$, which is a measure of chip performance, to limit chip power consumption and localized heating, also limits chip performance. Consequently, these electromigration workarounds have limited/mitigated device scaling benefits.

Moreover, semiconductor manufacturing carries substantial process variations and physical limitations. These manufacturing variations cause physical and electrical parameters to vary, perhaps by as much a two times (2×), or more, best case to worst case. These device parameters cause variations across the entire chip production population in threshold voltages ($V_T$), drain saturation currents ($I_{dSats}$), contact resistance, and material sheet resistance ($\rho_s$) and so forth. Statistically, in production some chips these variations are large enough for some parameters (e.g., for an "outlier" chip), to effect reliability risking field failures. These large multi-fingered drivers are especially sensitive to these variations. Predicting these failures has required extended stressing and screening, e.g., using kerf test sites with testable models of the most susceptible structures. Even so, it was very difficult to get empirical feedback from field fails to verify the accuracy of the EM modeling and chip use conditions.

Chip designers have included on-chip low frequency sensors to measure average temperature in situ periodically, e.g., using diode forward bias voltages or metal resistance. However, for randomly occurring hot spot flare ups checking the temperature sensors is too infrequent, e.g., on the order of one hertz (~1 Hz), and very likely, with the sensors located peripherally and not at hot spot locations. So, recorded sensor data seldom reflects affects to most sensitive on-chip structures. Thus, collected data is seldom relatable to reliability issues that, especially in state of the art high performance ICs, are most likely to manifest in circuits with large multi-fingered or multi-fin devices. So, it is also very unlikely that any of the sensors capture local hot spot effects that cause failures, much less predict impending failures. Consequently, because chip users have no forewarning of impending failures, other than scheduled maintenance, users have little recourse than to wait for failures, react as they occur, and accept the consequences, e.g., expensive down time and emergency service calls.

Thus, there exists a need for accurately characterizing local effects on Integrated Circuit (IC) chip circuits that impact chip lifetime and internal element reliability; and more particularly, a need for monitoring sensitive multi-fingered IC chip devices for impending failures that occur during short duration events, making it impossible to identify or predict the occurrence of chip over-stressing prior to failure.

SUMMARY

It is an aspect of the invention forewarn Integrated Circuit (IC) chip users of impending chip failures;

It is another aspect of the invention to monitor IC circuits on-chip for an indication of a likely failure;

Yet another aspect of the invention is an on-chip sensor for monitoring active circuits with known parameter sensitivities for a quantitative indication that a monitored circuit is likely failure.

The present invention relates to a sensor for on-chip monitoring the effects of operating conditions on a circuit, Integrated Circuit (IC) chips including the sensors, and a method of monitoring operating condition effects on-chip circuits, e.g., for the occurrence of electromigration. The sensor includes a multi-fingered driver associated with a monitored circuit, sensitive to known circuit parameter sensitivities. Sense and control logic circuit selectively driving the multi-fingered driver, and selectively monitoring for an expected multi-fingered driver response.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION

Figure 1A:
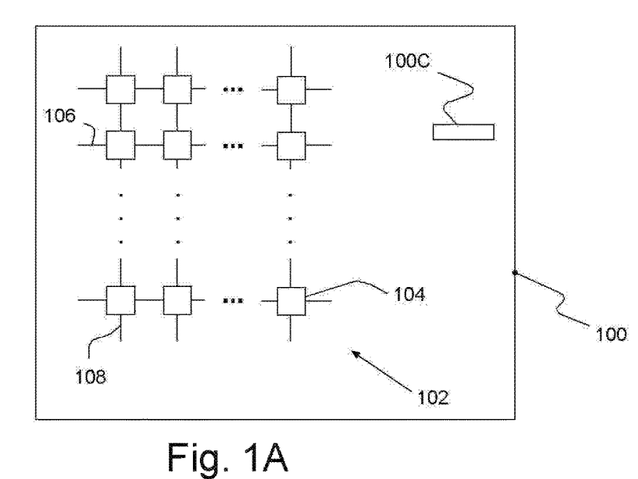
FIGS. 1A-C show an example of an integrated circuit (IC) chip monitoring local conditions for potential failures in circuits according to a preferred embodiment of the present invention.
Figure 1B:
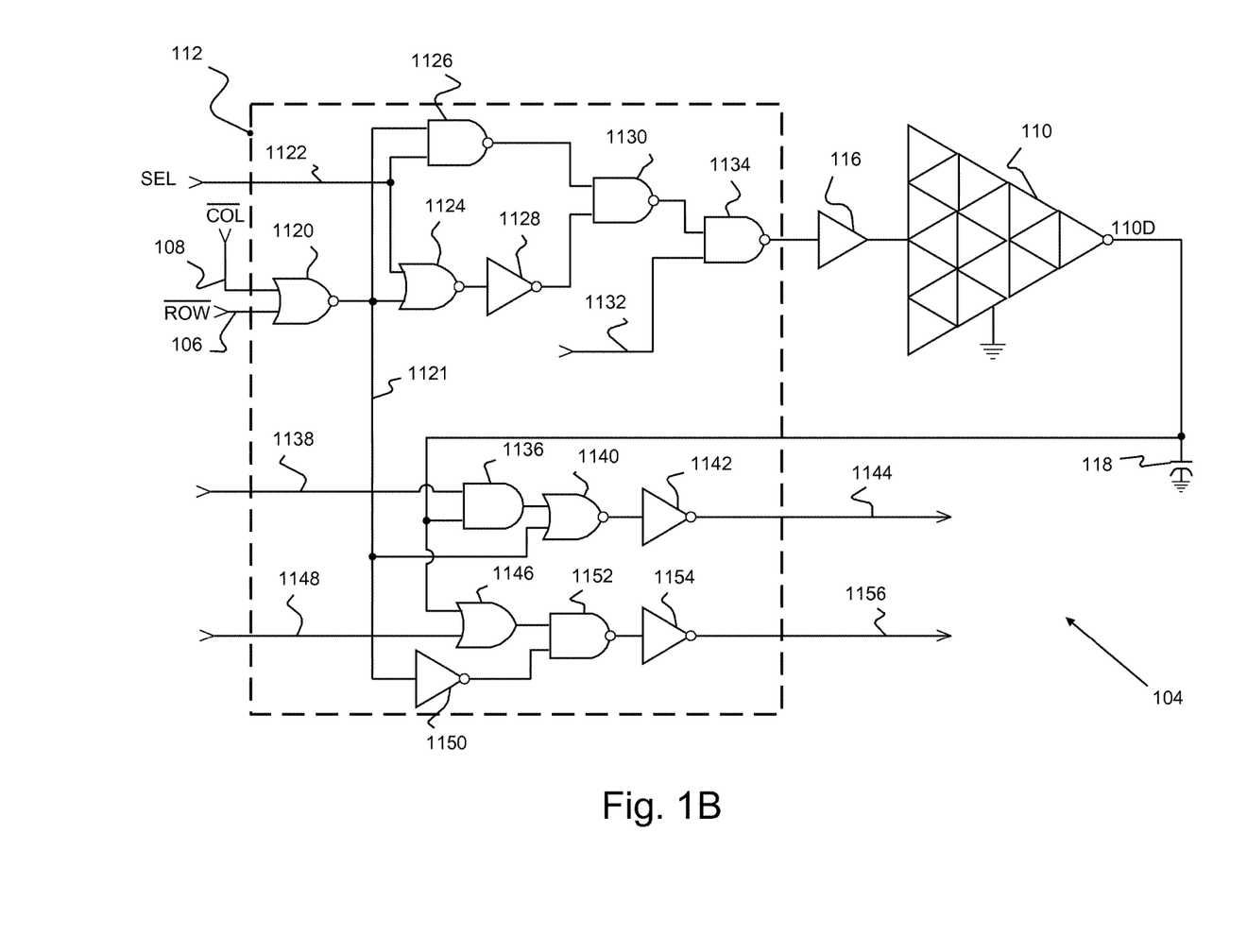
Figure 1C:
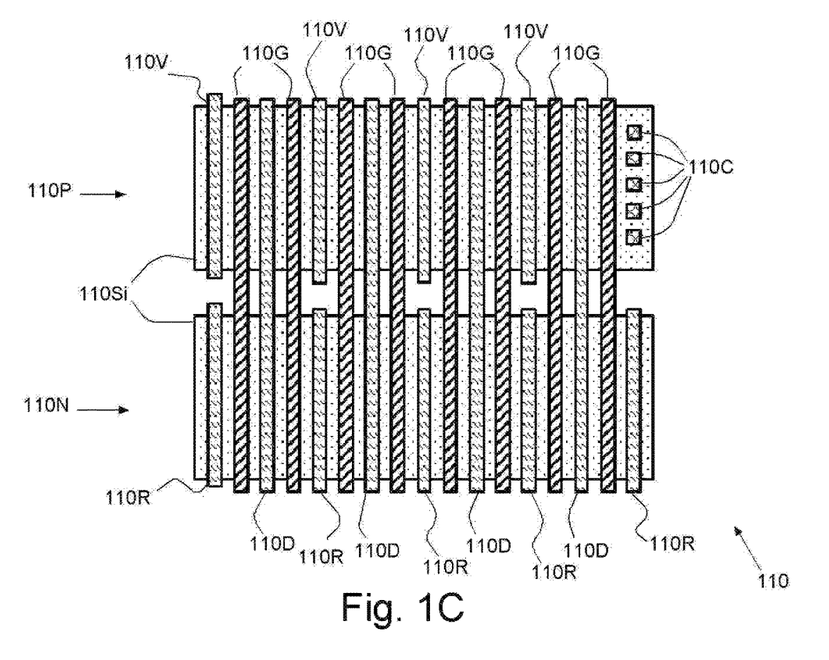

Turning now to the drawings and, more particularly, FIGS. 1A-C show an example of an integrated circuit (IC) chip 100 monitoring local conditions for potential failures in circuits 100C, according to a preferred embodiment of the present invention. In this example, the chip 100 includes an array 102 of preferred on-chip sensors 104, individually selectable by a respective row select 106 and column select 108. The preferred sensors 104 monitor parameter sensitivities under local operating conditions to determine effects on neighboring or adjacent chip circuits 100C. Thus, for example, sensors 104 in one row, column, or a subset thereof, may be sensitive to variations in each of device thresholds ($V_T$), driver load, internal gain, device size/thermal resistance, and any other selected design/layout variations. The row selects 106 and column selects 108 may be directly connected to, and selected from, chip pads (not shown), and the same pads can be re-used for multiple arrays 102.

Each preferred sensor 104 in this example includes a multi-fingered test driver 110, sense and control logic 112, a control logic buffer 116 and a load, e.g., capacitor 118. The control logic buffer 116 drives the multi-fingered test driver 110. The load capacitor 118 is selected to load the multi-fingered test driver 110 for the particular monitored sensitivity.

Sense and control logic 112 includes an array cell select NOR gate 1120 receiving the respective row select (¬ROW) 106 and column select (¬COL) 108 that selects 1121 the particular sensor 104. A test select (SEL) 1122 combines with the sensor select output 1121 in NOR gate 1124 and NAND gate 1126. An inverter 1128 inverts the output of NOR gate 1124. The output of NAND gate 1126 combines with the inverted output of NOR gate 1124 in NAND gate 1130. The output of NAND gate 1130 selectively passes the stress/test signal 1132 through NAND gate 1134, which drives control logic buffer 116.

AND gate 1136 combines the multi-fingered test driver 110 output 110D at load capacitor 118 with the corresponding results from previous array sensor or stage at AND input 1138. NOR gate 1140 combines the sensor select output 1121 with the output of AND gate 1136. Inverter/driver 1142 inverts the output of NOR gate 1140 to provide the AND output 1144 from this stage 104.

Similarly, OR gate 1146 combines the multi-fingered test driver 110 output with corresponding results from previous array sensor or stage at OR input 1148. Inverter 1150 inverts the sensor select output 1121. NAND gate 1152 combines the output of inverter 1150 with the output of AND gate 1146. Inverter/driver 1154 inverts the output of NAND gate 1152 and provides the OR output 1156 from this stage 104.

Preferably, a simple multi-fingered test driver 110 includes a pair of multi-fingered devices, e.g., a PFET 110P and an NFET 110N. In this simple multi-fingered inverter 110 example, both PFET 110P and NFET 110N share eight gates 110G defining eight FETs of each type on appropriately doped semiconductor 110Si. One side (the source diffusion) of each PFET 110P finger is tied to a supply ($V_{dd}$) line 110V. One side (the source diffusion) of each NFET 110N finger is tied to a supply return or ground (Gnd) line 110R. The other side (the drain diffusions) of the individual PFETs 110P and NFETs 110N are connected together 110D, providing the driver 110 output. Metal supply lines 110V, supply return lines 110R, and drain lines 110D connect to drain diffusions through interlevel contacts or vias 110C. Connecting or ganging all gates 110G together and all drain diffusions 110D together, completes a single eight fingered driver 110.

It should be noted that driver, buffer, and inverter may be used interchangeably herein with regard to the multi-fingered test drivers 110. This is not intended to differentiate between particular embodiments as typically, inverters of various (usually larger) sizes are used for buffers and drivers. Further, the number of fingers is selected by design for the particular parameter(s) being monitored.

It is apparent that ganging all of the fingers together in these multi-fingered driver devices 110P, 110N (and in FinFETs) introduces redundancy that in a typical multi-finger driver may involve a different type of component failure than a hard fail. An open wire, or source/drain short causes a hard fail in a single driver/FET. Hard fails are detectable as logic state, either a stuck zero ("0") or a stuck one ("1"). By contrast, a loss of a redundant portion may not be detected so easily. Instead, hard fail shorts and opens at single fingers are overcome, frequently, by the remaining, functioning fingers. While the loss of one or more fingers in one of the ganged devices/drivers impairs signal performance, that failure may show up as intermittent errors that, previously, were hard to identify. The preferred sensor, however, may include logic, such as a latch, to indicate those otherwise hidden failures.

By design the multi-fingered test driver 110 can be more sensitive to thermal resistance, for example, by increasing finger count, by increasing FET width, by the number of contacts included, and by decreasing metal density to modify metal heat removal. Also, stress sensitivity may be heightened by increasing switching frequency, skew with load variations, and/or by reducing sensor transient and/or static reliability. For example, modifying metal wire design reliability and implanting FET drains (110D) to enhance device electric fields modifies transient reliability. Static reliability can be modified, for example, by reducing FET threshold voltages to increase sub-threshold current leakage.

Figure 2:
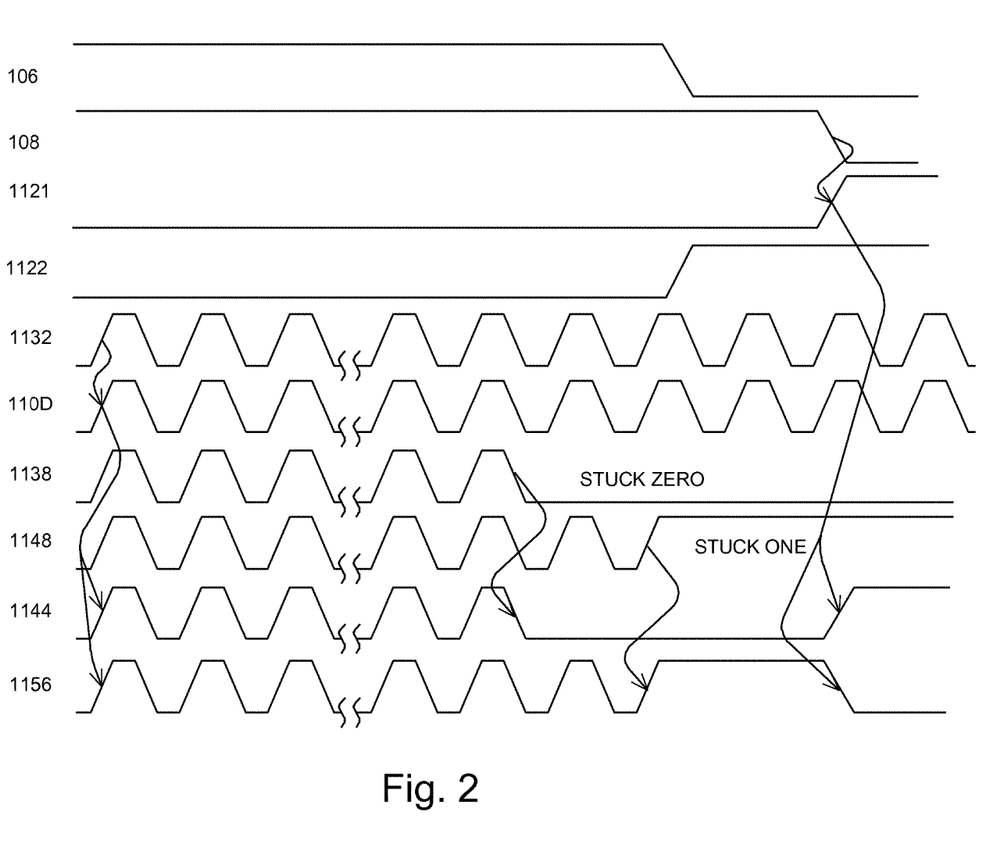
FIG. 2 shows a timing diagram example for the sensor.

FIG. 2 shows a timing diagram example for a sensor 104 in the array 102, e.g., as shown in the example of FIGS. 1A-C. During normal chip operation SEL 1122 is low, and both ¬ROW 106 and ¬COL 108 are high deselecting the sensors or stages 104. With either/both ¬ROW 106 and ¬COL 108 high the sensor select output 1121 is low. The low on the sensor select output 1121 holds the NAND output 1126 high and passes SEL 1122 through NOR 1124 and inverter 1128 to NAND gate 1130. NAND gate 1130 inverts SEL 1122, passing stress/test signal 1132 through NAND gate 1134 to control logic buffer 116, which drives the multi-fingered test driver 110. Driver 110 in turn drives output 110D loaded by load capacitor 108.

The stress/test signal, e.g., the chip clock, at input 1132 may switch the buffer/inverter 110 at a high stress frequency, i.e., the clock frequency. This high frequency switching reproduces clock driver stress on the sensor 104 that by design, in this example, is suitable for monitoring active clock driver operation and for monitoring stress on other high duty cycle circuits. Thus, stressing these drivers 110 emphasizes FET switching transition mechanisms, switching from on to off, e.g., for sensing hot-carrier effects and/or higher current electromigration.

As long as none if the array 102 drivers 110 experience failures (stuck faults), all of the array 102 AND outputs 1144 and OR outputs 1156 reflect the stress/test signal 1132, i.e., switch with the chip clock frequency. Thus, when stress/test signal 1132 is high, test driver 110 output 110D, previous AND input 1138 and previous OR input 1148 are high; and, when stress/test signal 1132 is low, test driver 110 output 110D, previous AND input 1138 and previous OR input 1148 are low. Thus, when the stress/test signal 1132 is switching or toggling, both AND output 1144 and OR output 1156 are toggling.

If any array 102 driver 110 fails, the failures for this example may include an open circuit at the driver 110, a stuck one, or a stuck zero. For an open circuit toggling ceases at that sensor, and at least in part (on one or both of the outputs 1144, 1156), for subsequent array sensors.

For a stuck zero, the driver output 110D remains low for the faulty driver. OR gate 1146 continues to pass the signal from previous OR input 1148 to the OR output 1156. The low to AND gate 1136 blocks the signal from previous AND input 1138. Since the sensor select output 1121 is low, both inputs to NOR gate 1140 are held low, to provide a continuous low on AND output 1144. A low input to the next sensor 104 on previous AND input 1138 propagates through to the last sensor stage reflecting a stuck zero input one or more sensors 104 in the array 102.

Similarly, for a stuck one, the driver output 110D remains high for the faulty driver. AND gate 1136 continues to pass the signal from previous AND input 1138 to the AND output 1144. The high to OR gate 1146 blocks the signal from previous OR input 1148. Since the sensor select output 1121 is low to inverter 1150, both inputs to NAND gate 1152 are held high, to provide a continuous high on OR output 1156. The high, which is the previous OR input 1148 to the next sensor 104, propagates through to the last sensor stage reflecting a stuck high in one or more sensors 104 in the array 102. Detecting a fault is relatively easy, e.g., with an exclusive or (EXOR), a glitch filter and a set-reset (SR) latch.

When a fault occurs, the array 102 sensors 104 are selected one by one to select individual sensors 104 to isolate and identify any failing driver(s) 110. So, holding both ¬ROW 106 and ¬COL 108 low selects the sensor 104, driving the sensor select output 1121 high. The high on the sensor select output 1121 forces the output of NOR gate 1140 low, which forces the AND output 1144 high; and, forces the output of NAND gate 1152 high, which forces the OR output 1156 low. Thus, with the array 102 sensors 104 daisy chained (output to input), selection enables the driven stress/test signal 1132 in subsequent sensors to propagate from the selected sensor to the end of the array 102 chain.

Walking sensor selection back from end to start identifies the latest failing sensor in the chain.

So for example, a preferred sensor 104 or sensor array 102 may be embedded in the middle of a large inverter for monitoring and sensing thermal environment in the inverter. For the application of this example, the PFET 110P and NFET 110N gates 110G are separate (not shown), and driven individually with two different signals that are independently switchable. In particular, the selected PFET 110P and NFET 110N are biased and sized to fail upon an over temperature condition. Thus, during stress test, e.g., burn in, both devices 110P and 110N are held on simultaneously. In particular, PFET 110P and NFET 110N may be selected relatively small to limit static or DC current flow and the corresponding contribution to chip power consumption. Subsequently with both FET 110P and 110N gates switching together, the driver 110 operates normally with the failure to pull high and low indicating a hard fail in the drive, and slow switching indication a partial (finger) fail. Advantageously, this is not susceptible to device leakage, which may exhibit significant local variability as compared to active device on current. This sensor-inverter configuration provides for sampling the thermal environment of the monitored inverter independently of leakage.

Figure 3:
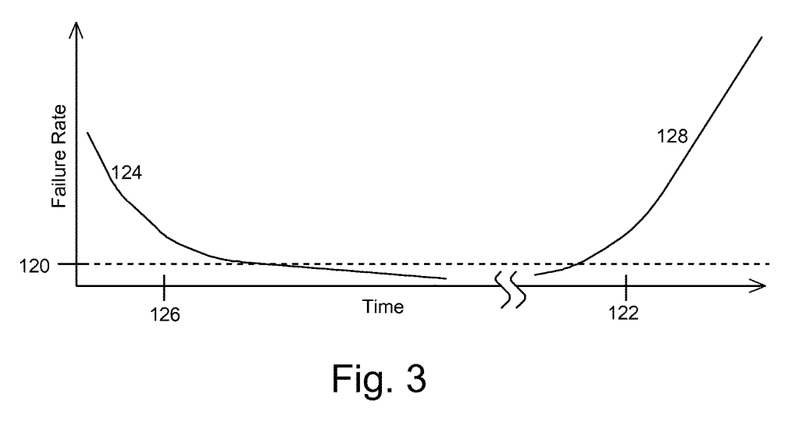
FIG. 3 shows an example of semiconductor chip failure rate over operating time for a specified average failure rate with a projected "end of life.

FIG. 3 shows an example of semiconductor chip (e.g., 100 in FIG. 1A) failure rate over operating time for a specified average failure rate 120 with a projected "end of life" 122. It is well known, also, that chips 100 fail more frequently early on with an early life failure rate 124, also known as the infant mortality rate. Normally, infant mortality occurs during a very short, initial period 126 with chips surviving past that period 122 failing at the average failure rate 120. Typically, manufacturers mitigate infant mortality, accelerating early fails by operating chips 100 at extremes, or slightly beyond, prior to shipment for some period, called burn in. Chips 100 that survive burn in and infant mortality 126 tend to fail at the much lower, average or random failure rate 120 until they reach end of life 122. After end of life 122 failures accelerate as chips wear out, failing at the wear out failure rate 128. One measure of chip reliability is how well the actual failure rate matches the predicted failure rate. Preferred sensors 104 facilitate monitoring for fails and adjusting for those fails to maintain chip reliability by limiting down time from failing chips.

Strategically located preferred sensors (e.g., 104 in FIGS. 1A-C) provide for identifying reliability issues and predicting potential reliability fails to minimize any necessary burn-in. Frequently, these fails arise and occur from exceeding normal operating conditions over a relatively short period, e.g., well below one millisecond (1 ms), which has made it difficult to monitor and identify the cause of the failure(s). For example, thermal runaway can cause a circuit failure in even as little as ten nanoseconds (10 ns). Circuit operating conditions can spike, for example, because of excessive loads, power supply voltage variations, operating frequency variations. Whether operating conditions temporarily spike over-temperature, over-voltage or over-frequency (over-stressing conditions), the operating spikes can cause failures in one or more chip circuits and make it difficult or impossible to predict that chip over stressing has occurred until the chip fails. Further, a hard fail may not occur if the fail only partially incapacitates the driver 110, causing system down time and expensive field service calls to address the failure.

Biasing the sensors 104 for normal operating conditions integrates the impact of operating mechanisms limiting reliability into the respective driver 110. By design the sensors 104 fail first, i.e., have a higher fail likelihood than the protected circuits. So for example, three drivers 104 may be located at a monitored circuit, each including a buffer or driver 110 with increasingly higher thermal resistance. Thus when a failure occurs, where it occurs indicates the severity of the failure with a minor failure occurring in the most sensitive driver, and a severe failure in all three drivers. Identifying a failure and the severity of the failures quantifies the likelihood of failure, providing information for selecting an appropriate response to the fail. For example, a fail in the more sensitive buffer could signal for triggering a controlled system shut down to avoid a major fault from a complete chip failure. Alternately, a fail on less sensitive drivers may signal for immediate corrective action, e.g., warning a system administrator to shut down immediately and initiate a field service call.

Figure 4:
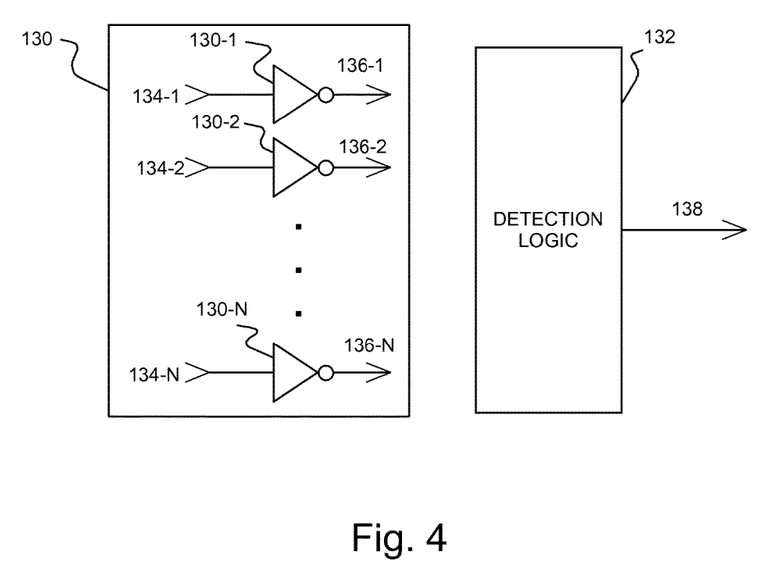
FIG. 4 shows a schematic example of a multi-fingered test driver 130 and fault detection logic.

FIG. 4 shows a schematic example of a configurable multi-fingered test driver 130 and fault detection logic 132, e.g., substantially similar to driver 110 and sense and control logic 112 in FIGS. 1A-C. In this example the configurable multi-fingered test driver 130 includes a number (N) of identical individual fins, drivers, inverters, fingers, 130-1, 130-2, ..., 130-N. Thus again, each individual inverter or driver 130-1, 130-2, ..., 130-N includes one or more pairs of FETs, a PFET and NFET, each pair with a common gate on respective channels. Each driver 130-1, 130-2, ..., 130-N has an input 134-1, 134-2, ..., 134-N and an output 136-1, 136-2, ..., 136-N. Drivers 130-1, 130-2, ..., 130-N may be connected by design the same or differently in multiple test sensors to exhibit a sensitivity range for quantifying one or more known failure mechanisms. Fault detection logic 132 senses a hard or, optionally, a soft failure in the drivers 130-1, 130-2, ..., 130-N and provides a fault signal 138 indicative of the particular driver 130 failure. In this example, a clock input 114 clocks the fault detection logic 132, e.g., one or more scannable latches, and may provide a drive signal for the drivers.

Figure 5A:
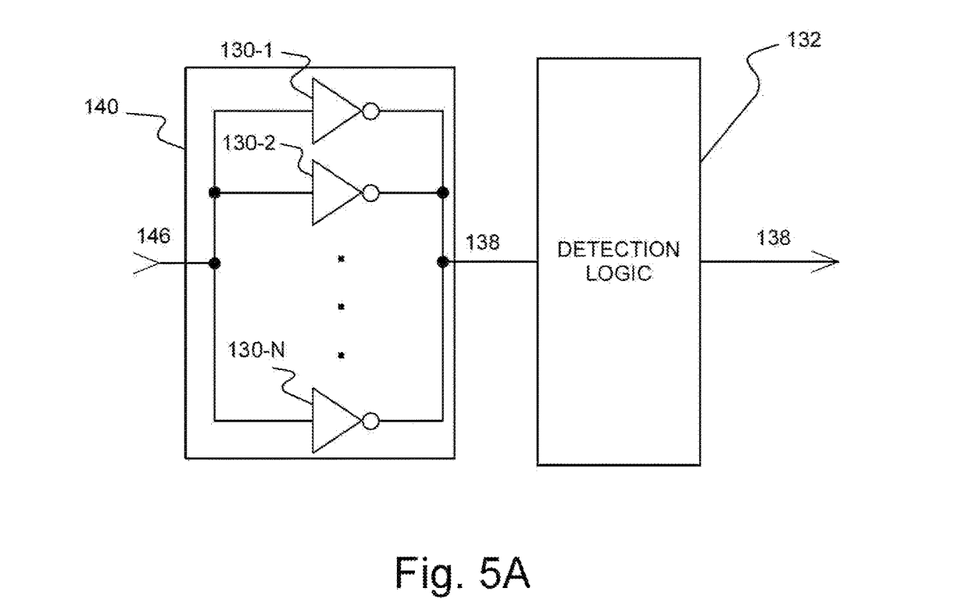
FIGS. 5A-C show examples of the multi-fingered test drivers connected for sensing failures in different sensitivity ranges to known failure mechanisms.
Figure 5B:
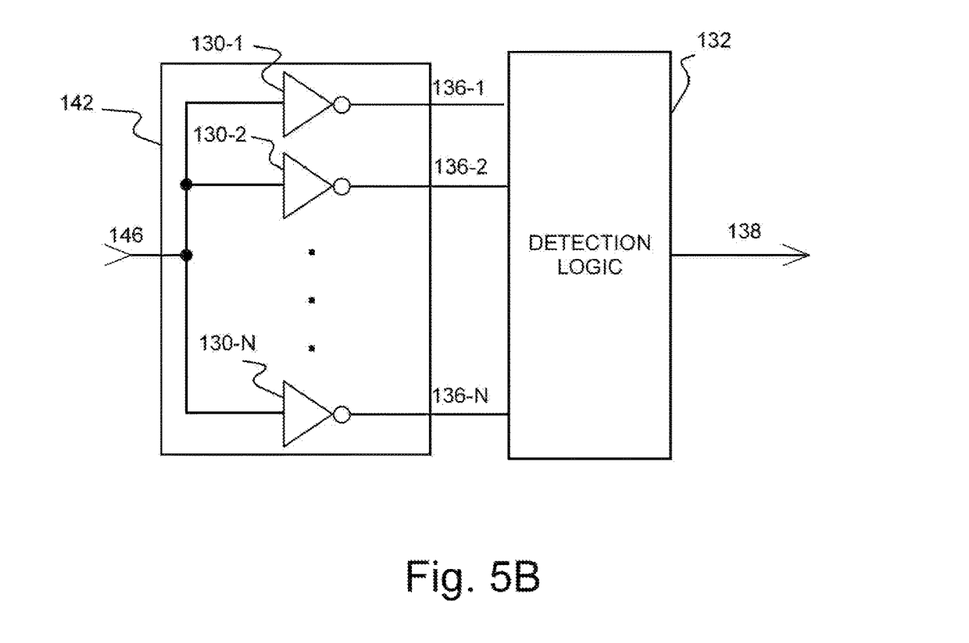
Figure 5C:
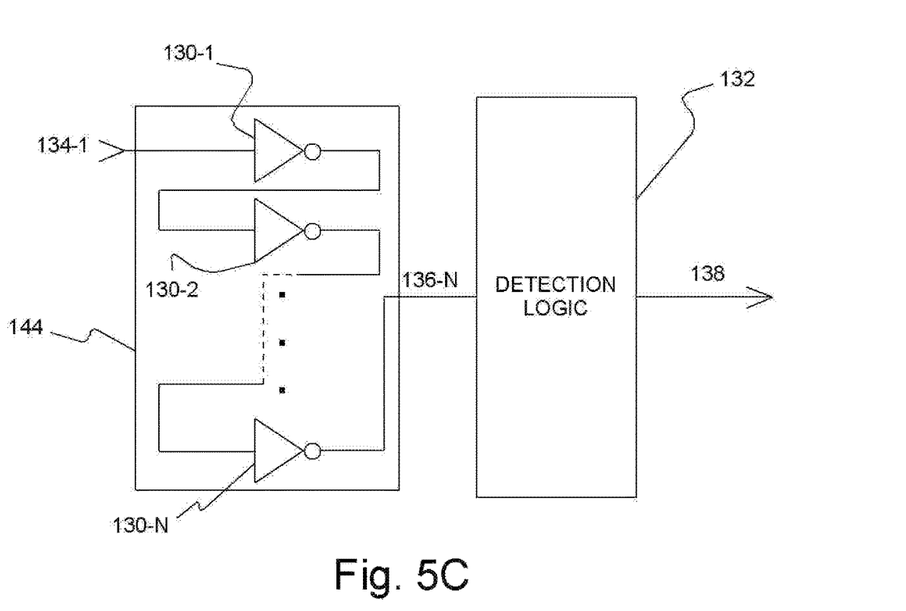

FIGS. 5A-C show examples 140, 142, 144 of application of the configurable multi-fingered test drivers 130 in FIG. 4 with the multi-fingered drivers 130-1, 130-2, ..., 130-N configured for sensing failures to quantify different sensitivity ranges to known failure mechanisms with like features labeled identically. Although shown in these examples as each including the same number N of multi-fingered drivers 130-1, 130-2, ..., 130-N, this is for simplification of explanation and example only. It is understood that both the number of fingers and the number of inverters is selected by design for the particular application and selected sensitivity.

Thus, in the first example 140, the drivers 130-1, 130-2, ..., 130-N share a common input 146 with all of the outputs tied together as the common input 148 to the fault detection logic 132. As noted hereinabove, a pair of multi-fingered FETs, a PFET and NFET, may form individual drivers 130-1, 130-2, ..., 130-N with a common gate and common source/drain contacts on each. Alternately each driver 130-1, 130-2, ..., 130-N may be a pair of multi-fingered FETs.

Loss of a single finger or inverter from multi-fingered driver 130-1, 130-2, ..., 130-N connection in first driver 140 is undetectable as a static or DC fail, i.e., an open, short, or a stuck one or zero. Instead, a single inverter failure manifests as reduced performance, e.g., with the introduction of clock skew or a timing failure where a signal edge arrives late, perhaps intermittently. Thus, this first driver 140 is least sensitive to, or in this example insensitive to, single inverter failures. While this insensitivity makes it more difficult to detect single inverter failures, a failure in this driver indicates a catastrophic failure is occurring or is about to occur.

In the second example 142, the drivers 130-1, 130-2, ..., 130-N share the same common input 146. However, the individual outputs 136-1, 136-2, ..., 136-N are inputs to the fault detection logic 132. Each of drivers 130-1, 130-2, ..., 130-N may be a pair of single, multi-fingered FETs, a PFET and NFET, each with a common gate on the FET fins.

Loss of a single inverter from the multi-fingered driver 130-1, 130-2, ..., 130-N connection in second driver 142 is detectable as a static or DC fail, i.e., an open, short, or a stuck one or zero in one output with other outputs continuing normally. Thus, loss of a single inverter is relatively easily detected with simple logic such as shown in FIG. 1B. This second driver 142 is moderately sensitive to single inverter failures.

In the third example 144 the multi-fingered test drivers 130-1, 130-2, ..., 130-N are daisy chained, with the output of one connected to the input of the next. The test signal to the first input 134-1 passes through the multi-fingered test driver 130-1, and the daisy chain to output 136-N, and passes to the fault detection logic 132. Again, each of drivers 130-1, 130-2, ..., 130-N may be a pair of multi-fingered FETs, a PFET and NFET, each with a common gate on the FET fins.

Thus, mixing these examples 140, 142, 144 can also provide a range of connections for a sensitivity range to different types of failures that may depend on the failure mode being monitored, e.g., for electromigration. Further, circuit sensitivities may be monitored with multiple instances of one example 140, 142, 144, or, each of multiple instances may be connected differently depending upon what is being monitored, e.g., three instances connected as in drivers 140, 142 and 144.

Further, the first two examples 140, 142 have application to a static or DC stress mode tests where the input 146 is held high or low, e.g., in two different sensors to hold the PFET in one on and the NFET off and vice versa. This simulates high leakage in unswitched circuits during dormant operational periods, and/or during high voltage burn-in. The on and off bias enhances static or unswitched effects on reliability, and serves to accelerate static or DC bias fails for characterizing reliability sensitivities.

Figure 6:
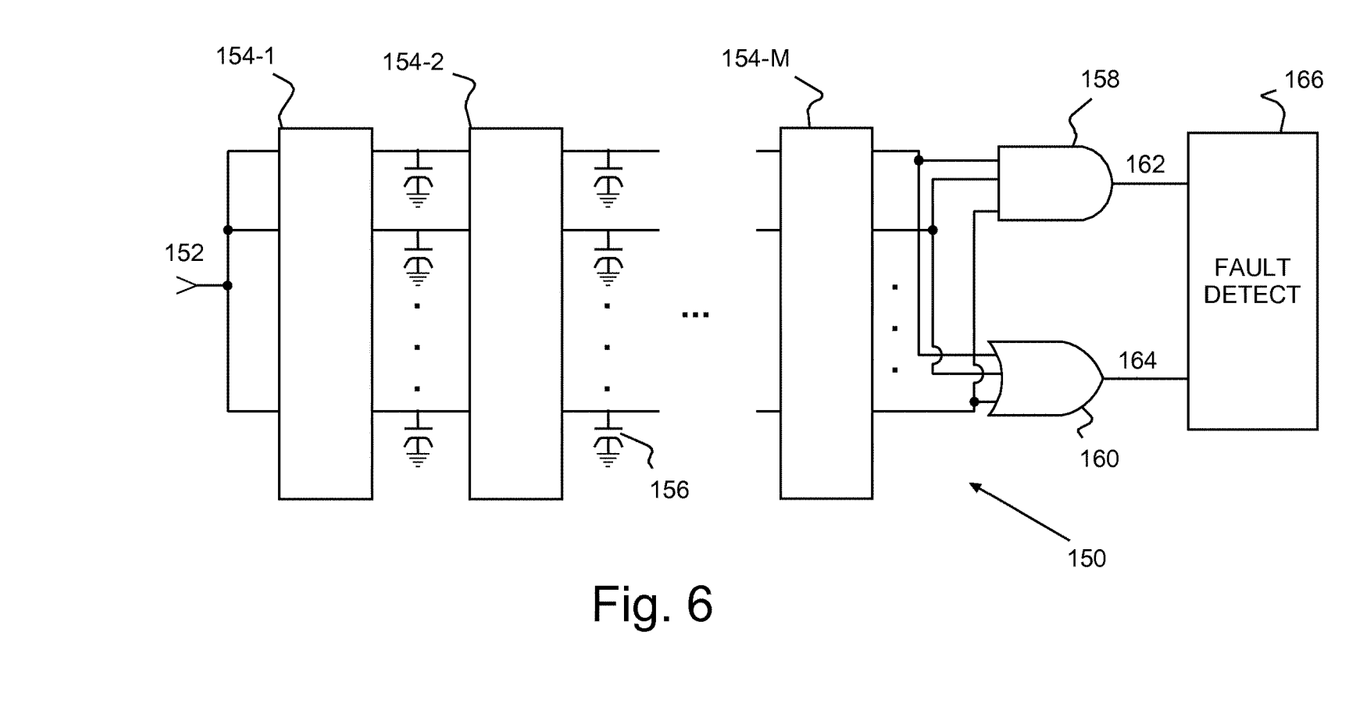
FIG. 6 shows another example of a test circuit for application of the present invention to sensing the occurrence of skew from failure of one or more fingers.

FIG. 6 shows an example of application of a test circuit 150 sensor sensing skew, e.g., caused by the failure of one or more driver fingers. In this example, a test signal or clock input 152 propagates through a number M of stages of multi-fingered test drivers 154-1, 154-2, ..., 154-M, where each stage nay be substantially similar to multi-fingered test driver 130. An identical capacitor 156 loads every individual driver, providing N identical paths re-driven by the multi-fingered test drivers 154-1, 154-2, ..., 154-M. All of the outputs of the final multi-fingered test driver stage 154-M are inputs to AND gate 158 and OR gate 160. AND gate 158 and OR gate 160 output 162, 164 reflect a fail in any one path, substantially as described for the sensor 104 in the example of FIGS. 1A-C and 2, hereinabove.

Thus, preferred sensors, e.g., 150, have use in determining and quantifying effects of uneven thermal distribution from a single heat source or from multiple heat sources. Uneven thermal distribution across the N identical paths may tend to shift operating points of individual multi-fingered test drivers. Such a shift alters signal propagation for signals traversing the sensor 150 signal paths, for example, such that path delays vary. This delay variation manifests in that the signal arrival times vary (i.e., the signals are skewed) at the logic gates 158 or 160. Thus, the AND gate 158 reflects both stuck zeros and late arriving ones with a low on output 162. Likewise, the OR gate 160 reflects both stuck ones and late arriving zeros as a high on output 164. Fault detect logic 166, e.g., a clocked latch, detects a fail reflected on outputs 162, 164.

Figure 7:
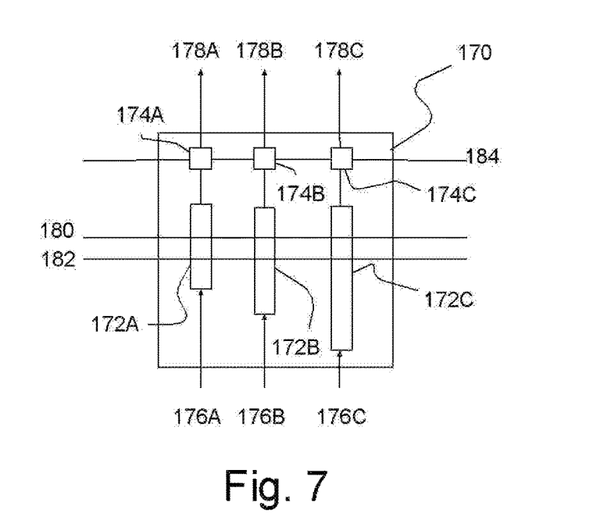
FIG. 7 shows an example of another IC chip sensor for sensing multi-fingered test driver failures.

FIG. 7 shows another example of an IC chip sensor 170 for sensing and quantifying multi-fingered test driver 172A, 172B, 172C failures in this example with 3 multi-fingered test drivers, e.g., substantially as described for FIGS. 1A-C. Similar sense logic 174A, 174B, 174C senses a fail in a respective multi-fingered test driver 172A, 172B, 172C. A test pattern to driver inputs 176A, 176B, 176C gates each multi-fingered test driver 172A, 172B, 172C. Monitoring the driver outputs 178A, 178B, 178C provides an indication of failure in one or more of the multi-fingered test drivers 172A, 172B, 172C. Thus, the multi-fingered test drivers 172A, 172B, 172C may be stressed collectively by varying a common test pattern, the supply 180 and supply return or ground 182 levels and/or resistance, or individually with specific input 176A, 176B, 176C test patterns. A clock 184 provides for synchronizing results, e.g., in a scannable test register in sense logic 174A, 174B, 174C, with external circuits, and/or for scan testing.

In this example, for quantifying EM sensitivity, the selected multi-fingered test drivers 172A, 172B, 172C range from most EM sensitive to least EM sensitive. So, for example, a preferred sensor 172 may be formed using the basic driver 110 with different finger sizes in each driver 172A, 172B, 172C. Alternately, each driver 172A, 172B, 172C may have a different number of fingers or a different load. For example, with N=n, N=2n and N=3n, the drivers 172A, 172B, 172C may include 8, 16 and 24 fins, respectively. Including a range for the multi-fingered drivers 172A, 172B, 172C provides a range of responses to stress.

It should be noted that although shown in this example sensor 170 includes 3 test drivers 172A, 172B, 172C, this is for example only. A preferred sensor 170 can include more or fewer drivers, depending on the needs determined by design for quantifying the particular sensitivity. Sensors 170 may be located with fabrication characterization and testing structures, e.g., in kerf areas at the chip periphery for fabrication testing or, as described herein, on-chip with circuits for in situ monitoring. In situ monitoring can involve, for example, interval testing driver outputs 176A, 176B, 176C to assess whether chip structures are reaching, or have reached, an over-stress condition. This assessment can provide administrators with guidance in how to address chip conditions, e.g., whether to schedule preventative maintenance or to shut down for immediate maintenance. In an alternate embodiment one or more sensors 172 is/are used as circuit fuses to alter a chip logic and outputs by forcing overstress conditions.

Thus advantageously, preferred sensors allow for monitoring local on-chip operating conditions to identify and quantify temporary overstress conditions, e.g., over-voltage or over-frequency that may cause chip fails. Preferred sensors even monitor for over-stressing that occurs on a relatively very short time scale, e.g., from over-temperature spikes. Preferred sensors provide for monitoring changes in circuit operating conditions that occur, for example, from excessive loads, power supply voltage variations, operating frequency variations. Thus, preferred sensors make it possible to sense after the short duration events, that chip over stressing occurred, especially in those frequent cases where it was previously impossible to tell.

Moreover, monitoring preferred sensors provides for quantifying the impact of temperatures, voltages, biased-temperature instability (BTI), hot carrier effects, electromigration and other mechanisms that limit reliability over the lifetime of a chip. By including sensors with a fail likelihood higher than monitored circuits, uses have an early warning for averting impending catastrophic fails. This provides for anticipatory action, such as a controlled chip shut down and replacing impacted chips, as well as wider field action for other chips from the same vintage. Further, manufacturers can make use kerf of sensor test results for wafer disposition, e.g., to identify especially sensitive lots, or for tracking root causes of the reliability fails.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A sensor for monitoring for the effects of operating conditions, said sensor comprising:
a multi-fingered driver associated with a monitored circuit on an integrated circuit (IC) chip, said monitored circuit having known parameter sensitivities, said multi-fingered driver being sensitive to one or more of said known parameter sensitivities;
a load capacitor selected to load said multi-fingered driver for a particular monitored sensitivity from the one or more said known parameter sensitivities;
a fail threshold for the particular monitored sensitivity of the sensor set higher than a threshold of the monitored circuit so that the sensor fails before said monitored circuit;
a load driven by said multi-fingered driver;
a sense and control logic circuit providing a drive signal selectively driving said multi-fingered driver, and selectively monitoring said load across fingers of the multi-fingered driver for detecting the fail threshold of the particular monitored sensitivity at any of said fingers to identify impending IC chip failure.

2. A sensor as in claim 1, wherein said IC chip is a CMOS IC chip and said multi-fingered driver is a CMOS driver including at least two field effect transistors (FETs) comprising a p-type PET (PFET) and an n-type FET (NFLT).

3. A sensor as in claim 2, wherein said CMOS driver is a multi-fingered inverter, said NI-ET is a fingered NFET and said PFET is a fingered NFET, the gate of said fingered NFET and the gate of said fingered PFET being selectively driven from said sense and control logic circuit.

4. A sensor as in claim 3, wherein said the gate of said fingered NFET and the gate of said fingered PFET are selectively independently driven from said sense and control logic circuit.

5. A sensor as in claim 2, wherein said sense and control logic circuit comprises:
control logic receiving select signals and providing said drive signal responsive to sensor selection; and
sense logic monitoring said load responsive to sensor selection and providing an indication whether said multi-fingered driver responded as expected.

6. A sensor as in claim 5, further comprising a control logic buffer receiving said drive signal and driving the gate of said fingered NFET and the gate of said fingered PFET.

7. A sensor as in claim 5, wherein said CMOS driver is one of a plurality of a CMOS drivers having a sensitivity range to one of said one or more known parameter sensitivities.

8. A sensor as in claim 5, wherein said one or more known parameter sensitivities is a plurality of known sensitivities, said CMOS driver is one of a plurality of a CMOS drivers, each said CMOS driver having a sensitivity to a different one of said plurality of known sensitivities.

9. A sensor as in claim 1, wherein said sensor monitors said monitored circuit for the effects of one or more of circuit temperature, circuit voltage, biased-temperature instability (BTI), hot carrier effects, and electromigration.

10. An Integrated Circuit (IC) chip comprising:
   one or more circuits having known parameter sensitivities; and
   one or more sensors monitoring at least one of said one or more circuits, each of said one or more sensors being sensitive to a selected known parameter sensitivity responsive to local operating conditions for the respective circuit, each of said one or more sensors comprising:
      at least one multi-fingered driver having parameter sensitivities selected to be sensitive one or more of said known parameter sensitivities,
      a load capacitor to load said multi-fingered driver with a selected monitored sensitivity from the one or more said known parameter sensitivities;
      a sensor fail threshold for the selected monitored sensitivity set higher than a threshold of the monitored circuit so that the sensor fails before said monitored circuit;
      a load driven by said at least one multi-fingered driver, and
      a sense and control logic circuit providing a drive signal selectively driving said multi-fingered driver, and selectively monitoring said load across fingers of the multi-fingered driver for detecting the fail threshold of the particular monitored sensitivity at said fingers whereby an identified failure in the multi-fingered driver indicates a catastrophic failure is occurring or is about to occur,
   the one or more sensors monitor neighboring one or more circuits to facilitate monitoring for fails and adjusting for those fails to maintain IC chip reliability by limiting down time from failing IC chips.

11. A CMOS IC chip as in claim 10, wherein said at least one sensor is a plurality of sensors monitoring different ones of said one or more circuits.

12. A CMOS IC chip as in claim 11, wherein said at least one sensor is a plurality of sensors comprising a sensor array, said CMOS IC chip further comprises a control logic buffer receiving said drive signal, and said sense and control logic circuit comprises:
   control logic receiving select signals and providing said drive signal responsive to sensor selection; and
   sense logic monitoring said load responsive to sensor selection and providing an indication whether said multi-fingered driver responded as expected.

13. A CMOS IC chip as in claim 12, wherein said plurality of sensors in said sensor array have sensitivity ranges to different selected said known parameter sensitivities.

14. A CMOS IC chip as in claim 10, wherein said multi-fingered driver is a CMOS driver including at least two field effect transistors (FETs) comprising a p-type FET (PFET) and an n-type FET (NFET).

15. A CMOS IC chip as in claim 10, wherein said CMOS driver is a multi-fingered inverter, said NFET is a fingered NFET and said PFET is a fingered NFET, the gate of said fingered NFET and the gate of said fingered PFET being selectively driven from said sense and control logic.

16. A method of monitoring circuits on an Integrated Circuit (IC) chip for the effects of operating conditions, said method comprising:
   providing a monitored circuit having known parameter sensitivities, and one or more sensors monitoring said monitored circuit;
   each of said one or more sensors comprising:
      at least one multi-fingered driver having parameter sensitivities selected to be sensitive one or more of said known parameter sensitivities,
      a load capacitor to load said multi-fingered driver with a selected monitored sensitivity from the one or more said known parameter sensitivities;
      a sensor fail threshold for the selected monitored sensitivity set higher than a threshold of the monitored circuit so that the sensor fails before said monitored circuit;
      a load driven by said at least one multi-fingered driver, and
      a sense and control logic circuit providing a drive signal selectively driving said multi-fingered driver,
   operating the monitored circuit under normal operating conditions;
   selectively operating the at least one multi-fingered driver associated with said monitored circuit, said multi-fingered driver being sensitive to one or more selected known parameter sensitivities of said known parameter sensitivities; and
   selectively monitoring the output of said multi-fingered driver for detecting the fail threshold of the particular monitored sensitivity at said fingers whereby an identified failure in the multi-fingered driver indicates a catastrophic failure is occurring or is about likely to occur in said monitored circuit.

17. A method as in claim 16, wherein said one or more of said known parameter sensitivities is a plurality of known sensitivities, and said multi-fingered driver is one of a plurality of multi-fingered drivers with a range of sensitivities to said plurality of known sensitivities, and failing to receive said expected response indicates a failure severity.

18. A method as in claim 16, wherein said one or more of said known parameter sensitivities is a plurality of known sensitivities, and said multi-fingered driver is one of an array of multi-fingered drivers with sensitivities to said plurality of known sensitivities, and failing to receive said expected response indicates a parameter failure type.

19. A method as in claim 16, wherein selectively operating said multi-fingered driver comprises holding said multi-fingered driver in a biased state.

20. A method as in claim 16, wherein monitored said known parameter sensitivities comprise circuit temperature, circuit voltages, biased-temperature instability (BTI), hot carrier effects, and electromigration.

* * * * *

UNITED STATES PATENT AND TRADEMARK OFFICE
CERTIFICATE OF CORRECTION

PATENT NO. : 10,191,108 B2
APPLICATION NO. : 14/945520
DATED : January 29, 2019
INVENTOR(S) : Gregory G. Freeman et al.

Page 1 of 1

It is certified that error appears in the above-identified patent and that said Letters Patent is hereby corrected as shown below:

In the Claims

Column 10, Line 48, Delete "PET" and substitute therefore -- FET --
  And delete "(NFLT)" and substitute therefore -- (NFET) --

Column 10, Line 50, Delete "NI-ET" and substitute therefore -- NFET --

Column 12, Line 41, Delete "likely"

Signed and Sealed this
Seventh Day of May, 2019

Andrei Iancu
*Director of the United States Patent and Trademark Office*